(12) United States Patent
Hayes

(10) Patent No.: US 8,749,310 B2
(45) Date of Patent: Jun. 10, 2014

(54) AMPLIFIER BIAS CONTROL

(75) Inventor: Kevin M Hayes, Sarasota, FL (US)

(73) Assignee: Kevin M. Hayes, Sarasota, FL (US)

( * ) Notice: Subject to any disclaimer, the term of this patent is extended or adjusted under 35 U.S.C. 154(b) by 0 days.

(21) Appl. No.: 13/409,628

(22) Filed: Mar. 1, 2012

(65) Prior Publication Data

US 2014/0055202 A1     Feb. 27, 2014

Related U.S. Application Data

(60) Provisional application No. 61/553,323, filed on Oct. 31, 2011.

(51) Int. Cl.
*H03G 3/30* (2006.01)

(52) U.S. Cl.
USPC ............................................. 330/285

(58) Field of Classification Search
USPC ................... 330/129, 285, 296, 279, 289, 298
See application file for complete search history.

(56) References Cited

U.S. PATENT DOCUMENTS

| | | | | |
|---|---|---|---|---|
| 6,008,698 A * | 12/1999 | Dacus et al. | | 330/279 |
| 6,130,582 A * | 10/2000 | Kesler | | 330/290 |
| 6,522,202 B2 * | 2/2003 | Brandt | | 330/285 |
| 6,734,729 B1 * | 5/2004 | Andrys et al. | | 330/129 |
| 7,102,442 B2 * | 9/2006 | Anderson | | 330/285 |
| 7,139,538 B2 * | 11/2006 | Ono et al. | | 455/127.1 |
| 7,622,994 B2 * | 11/2009 | Galal | | 330/290 |
| 8,008,974 B2 * | 8/2011 | Ha et al. | | 330/285 |
| 8,154,345 B2 * | 4/2012 | Andrys et al. | | 330/298 |
| 8,269,560 B2 * | 9/2012 | Na et al. | | 330/285 |
| 2002/0140511 A1 * | 10/2002 | Myers et al. | | 330/285 |
| 2009/0309661 A1 * | 12/2009 | Chang et al. | | 330/285 |

* cited by examiner

*Primary Examiner* — Khanh V Nguyen

(57) ABSTRACT

An improved method for maintaining optimal amplifier bias current utilizing a signal conditioning element 0710 which serves to symmetrically condition a sense voltage 0105 such that the sense voltage 0105 distortion is substantially determined by properties of the signal conditioning element 0710 rather than by properties of the amplifier amplification devices 0101 or the input perturbing signal.

13 Claims, 7 Drawing Sheets

Figure 1:
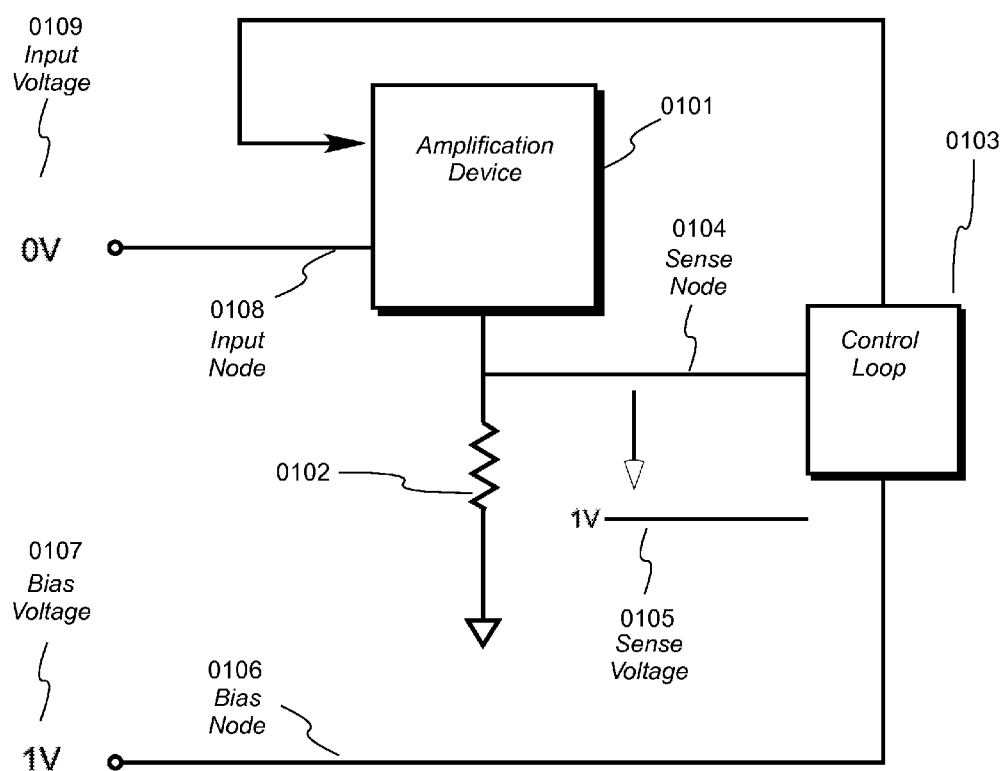

Sense Voltage in Class B
Operation Including Symmetrical Signal Conditioning

Sense Voltage with No Input Signal

Sense Voltage in Class A Operation

Sense Voltage in Class B Operation

Sense Voltage in Class B
Operation Including Diode Signal Conditioning

Diode Signal Conditioning

Diode High and Low Level Definition

Sense Voltage in Class B
Operation Including Symmetrical Signal Conditioning

Symmetrical Signal Conditioning

Symmetric High and Low Level Definition

AMPLIFIER BIAS CONTROL

The present invention is in the technical field of electronic amplifiers, more particularly in the technical field of audio power amplifiers.

BACKGROUND OF THE INVENTION

To realize high fidelity audio reproduction it is of paramount importance for an amplifying device's bias current to be maintained at the "optimal bias current" where the highest audio fidelity is achieved. Deviations from said optimal bias current alter the device's gain and frequency response which negatively impact audio quality.

Amplifier bias current is influenced by many factors like ambient temperature change, instability of bias setting circuitry and device performance parameter drift (transconductance and offset) over time. As such it is desirable to establish a methodology to automatically and autonomously account for and correct for these effects.

An electronic device's bias current can be inferred by imposing said bias current across a resistor to create a sense voltage. Electronic control loops can then be used to monitor the low frequency (DC) components of the sense voltage and make circuit adjustments to maintain said optimal bias current. The important inference here is that the sense voltage DC component is a faithful representation of said device bias current. In other words it is assumed that a constant proportionality exists between the sense voltage DC component and said device bias current. This is called the proportionality inference.

When no perturbing signal, such as an audio signal, is passing through the device said proportionality inference is valid and the sense voltage DC component is guaranteed to represent said bias current. As such any sense voltage DC deviation represents a true said bias current shift which is accompanied by a control loop response serving to cancel the deviation reestablishing said optimal bias current.

There is a range of perturbing signal amplitudes increasing from "smaller" to "larger" where the introduction of said perturbing signal will not affect the sense voltage DC component and thus maintain said optimal bias current. This region is the termed the class A range. Outside this range, however, said perturbing signal amplitude becomes large enough to cause sense voltage distortion which in turn adds a sense voltage DC component. This distortion induced DC component is indistinguishable from a DC component due to said bias current shift and consequently the control loop works to remove it. In other words large perturbing signals cause distortion which forces a control loop correction which serves to adjust the device away from said optimal bias current. The region in which a perturbing signal becomes large enough to cause appreciable sense voltage distortion is called the class B range. It is important to note that this definition of class B differs somewhat from the strict industry interpretation. For the sake of brevity it is expedient to classify distortions arising from operation in class AB and true class B, as defined strictly in industry, into the comprehensive term "class B". A control loop response resulting from a DC shift caused solely from entering class B operation is undesirable since said optimal bias is not maintained which negatively impacts audio quality.

Prior art approaches have attempted to minimize said class B sense voltage distortion by using limiting circuit elements (diodes) to limit the positive going portion of said sense voltage. This is called positive going limiting. One weakness of this approach is that the distortion introduced by negative going limiting is not considered or accounted for. Said negative going limiting adds distortion to said sense voltage which is neither systematic nor predicable, introducing DC components to the system which are incorrectly acted on by the control loop. The result is the control loop adjusts said bias current away from said optimal bias current value.

Another major failing of the prior art approach is that said positive going limiting depends on limiting circuit elements (like diodes) whose performance are strongly temperature dependent and not constant over time (drift). The result is that that said limiting circuit element can change said positive going limiting which causes an artificial DC component. A control loop response resulting from this DC component is undesirable since the device deviates from said optimal bias current.

SUMMARY OF THE INVENTION

This invention's purpose is to control a bias current to a known optimal bias current through an electronic amplification device independent of device performance parameter drift and independent of distortion caused by perturbing signals.

This disclosure describes an electronic circuit which controls said bias current to said optimal bias current of an electronic amplification device which operates, absent a perturbing signal, in class A mode but under the influence of a perturbing signal may enter class B operation. This invention automatically maintains the amplification device's said bias current at said optimal bias current irrespective of the class of operation.

The invention disclosed here involves preconditioning a sense voltage to make the said proportionality assumption valid independent of whether the device operates in class A or class B or if the device's performance parameters drift over time.

These advantages of the present invention will become obvious to those of ordinary skill in the art after having read the following detailed description of the preferred embodiments which are illustrated in the various drawing figures.

BRIEF DESCRIPTIONS OF THE DRAWINGS

FIG. 1 depicts a block diagram of an exemplary prior art control system used to establish a known bias current in an amplification device.

Figure 2:
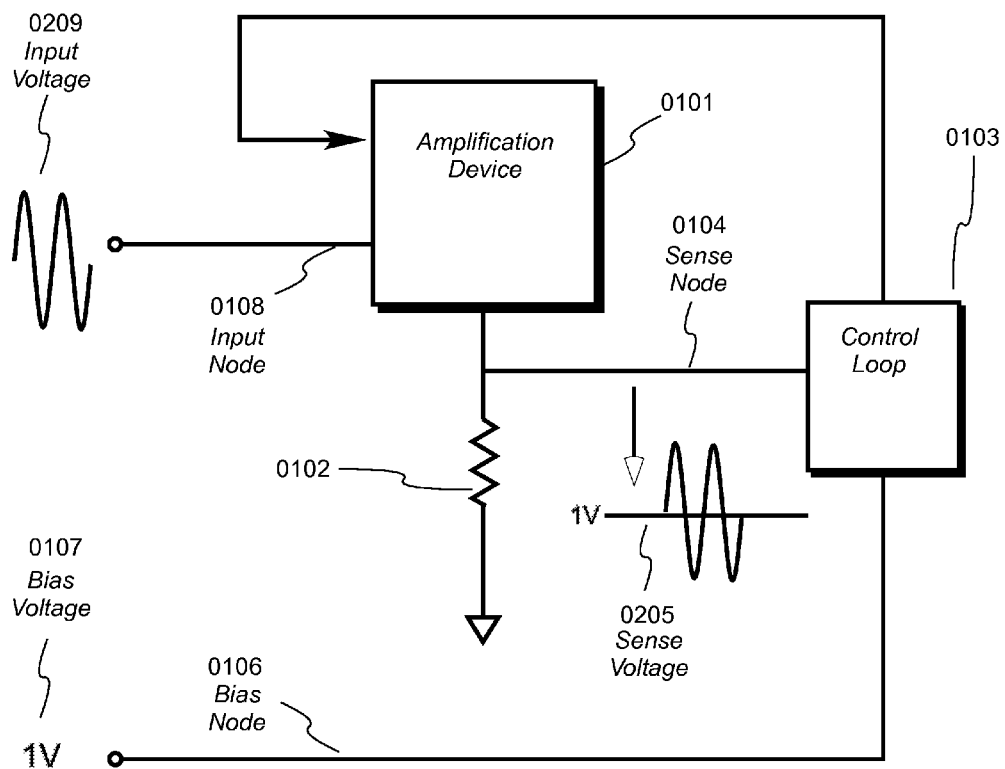

FIG. 2 introduces a "small" input signal to the exemplary prior art control system of FIG. 1. This signal causes the amplification device to operate exclusively in the class A region. As such no distortion appears at the sense voltage 0305 and no control loop corrective action is taken.

Figure 3:
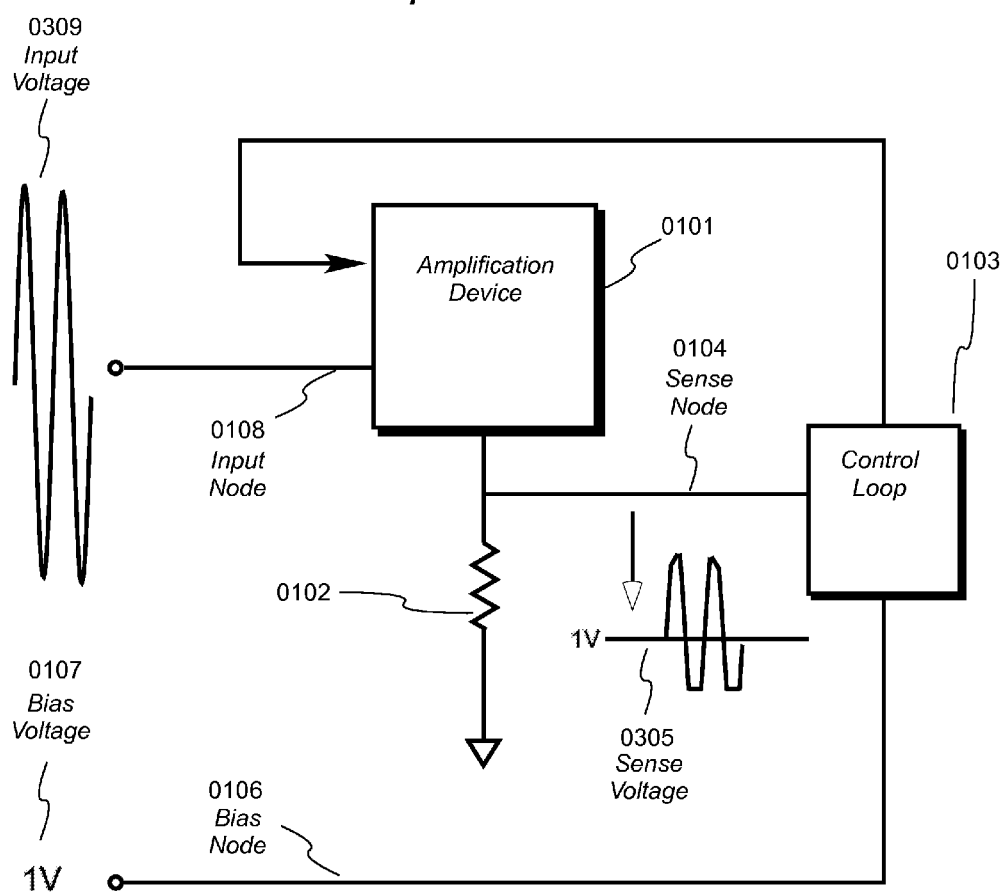

FIG. 3 introduces a "large" input signal to the exemplary prior art control system of FIG. 1. This signal causes the amplification device to enter the class B region and as such distortion appears at the sense voltage 0305. This distortion then produces an accompanying sense voltage 0305 DC component and an undesirable control loop correction.

Figure 4:
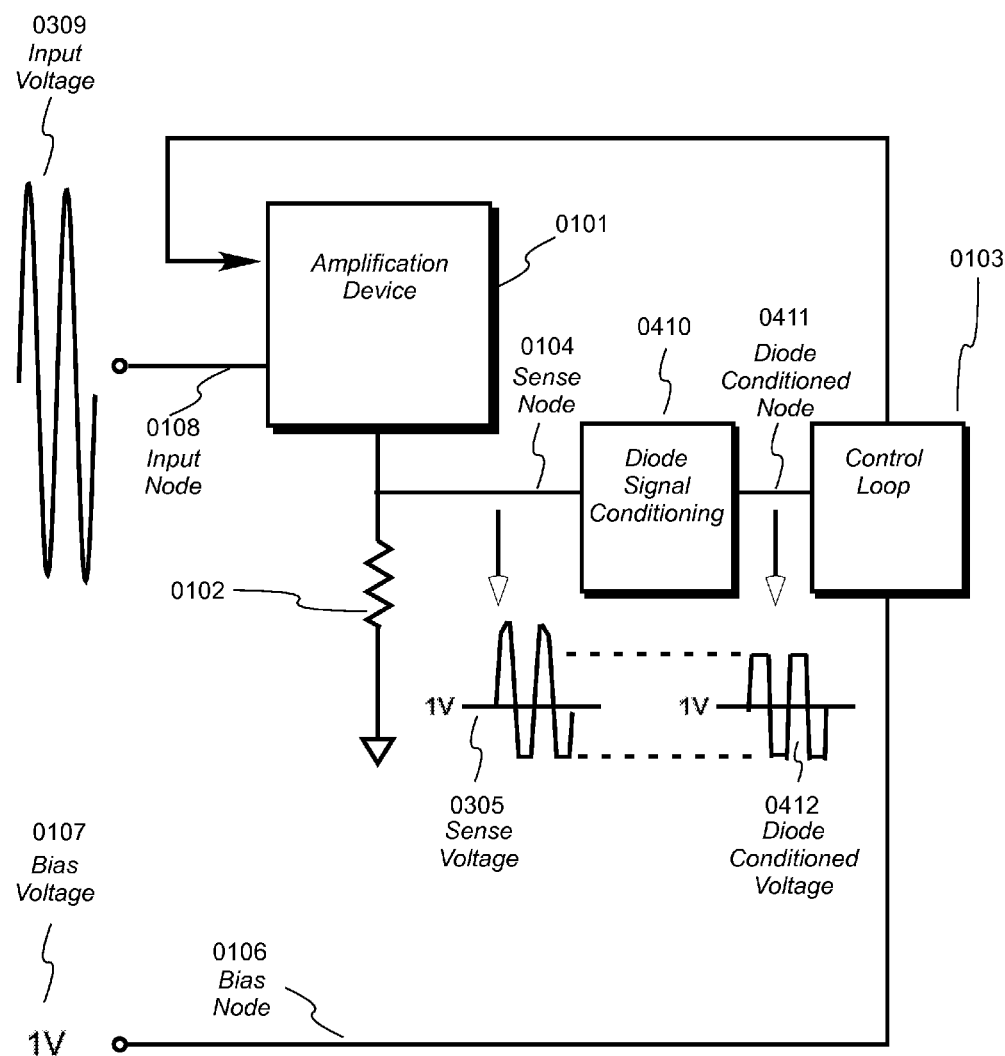

FIG. 4 introduces a diode signal conditioning block 0410 to the exemplary prior art control system of FIG. 1. The diode signal conditioning block's purpose is to limit the sense voltage's 0305 positive excursion to minimize the DC component introduced to the diode conditioned voltage 0412.

Figure 5A:
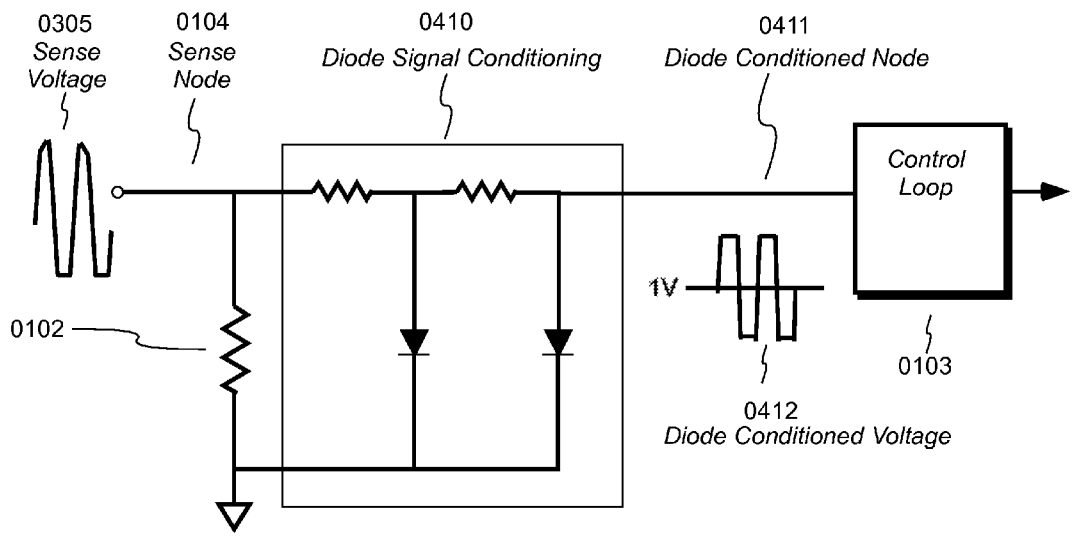
Figure 5B:
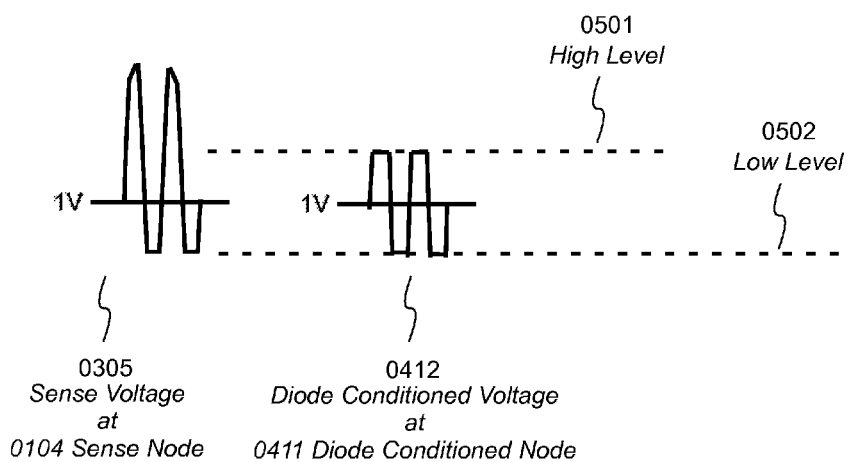

FIG. 5a adds detail to the prior art approach for the diode signal conditioning block 0410 of FIG. 4. The positive going excursion of the conditioned voltage 0412 is limited by a diode's forward voltage drop. The negative going excursion of the conditioned voltage 0412 is established by unpredictable and non-systematic properties of the amplification device 0101 of FIG. 4. FIG. 5b provides additional detail for the definitions of the high and low levels produced in response to the diode signal conditioning block 0410 at the diode conditioned voltage 0412. The high level 0501 is solely determined by a diode's forward diode drop and the low level 0502 is determined by properties of the amplification device 0101.

Figure 6:
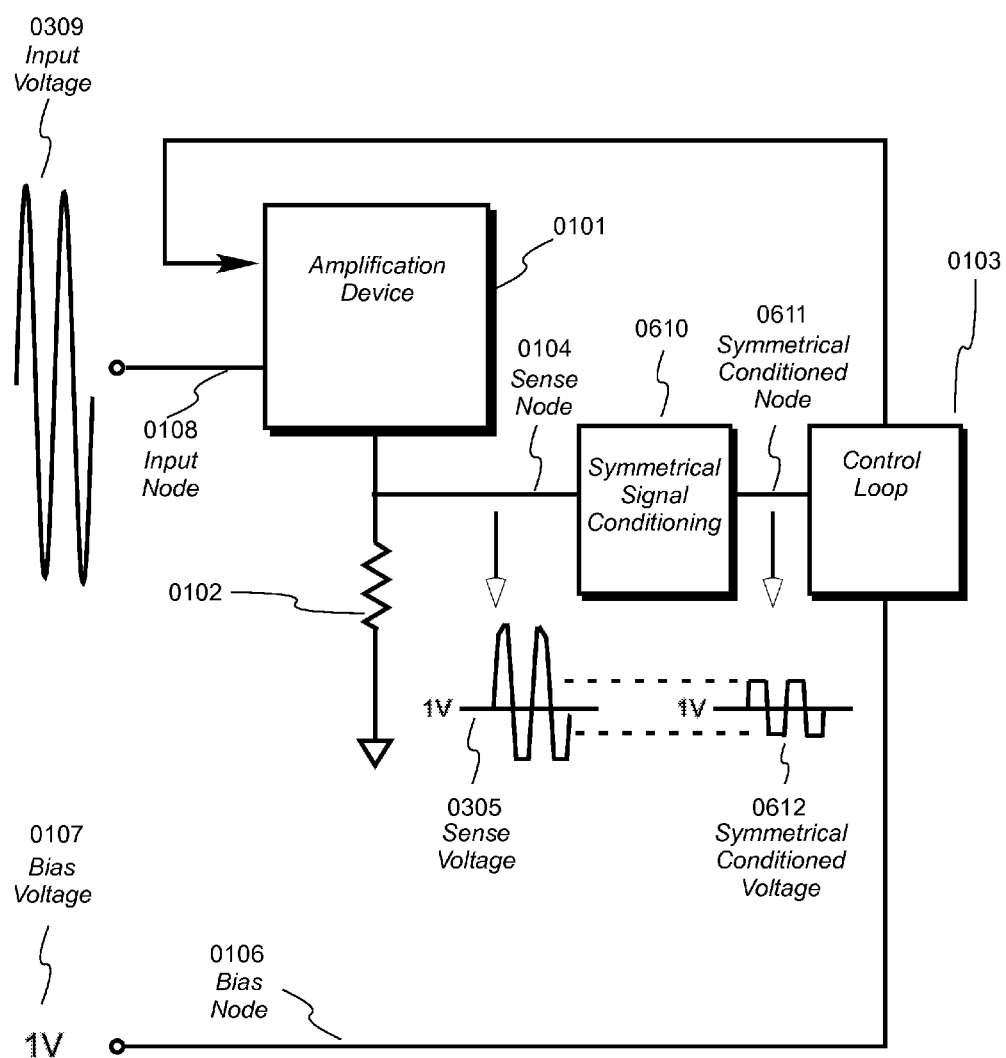

FIG. 6 discloses the present invention. A symmetrical signal conditioning block 0610 replaces the diode signal conditioning block 0410 of FIG. 4.

Figure 7A:
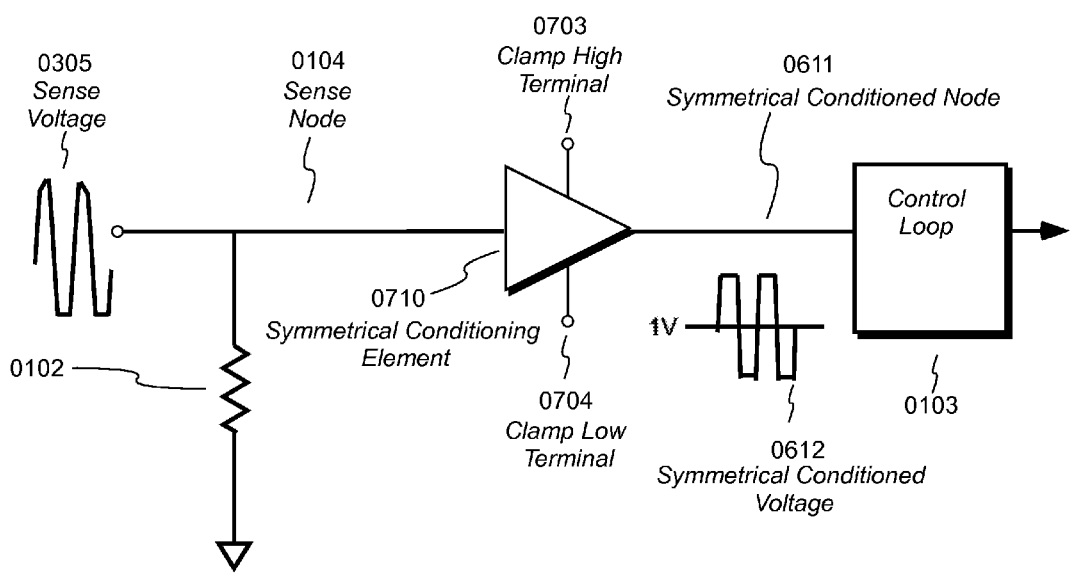
Figure 7B:
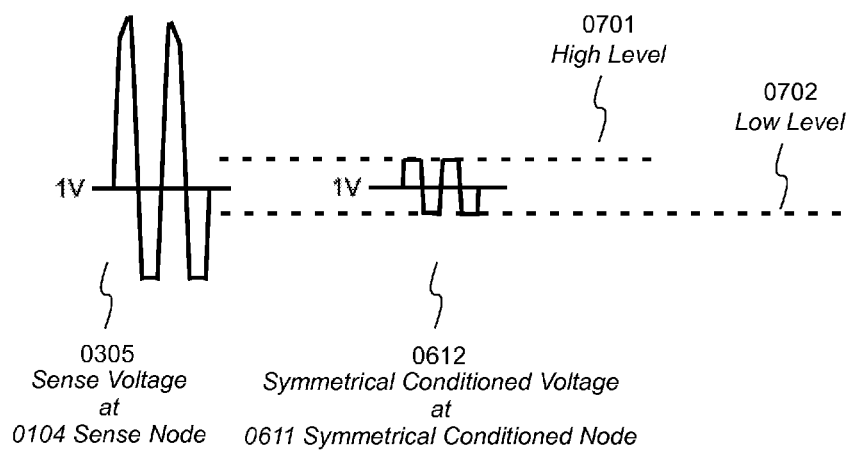

FIG. 7a introduces the symmetrical conditioning element 0710 which includes the clamp high terminal 0703 and the clamp low terminal 0704. FIG. 7b provides additional detail for the definitions of the high and low levels produced in response to the symmetrical signal conditioning block 0610 at the conditioned voltage 0612. Unlike in the prior art manifestations the high level 0701 is not established by diode forward drops and the low level 0702 is not influenced by properties of the amplification device 0101. Instead both the high 0701 and low 0702 levels are produced by a common, systematic, and predictable mechanism.

DETAILED DESCRIPTION OF THE INVENTION

FIG. 1 depicts an exemplary prior art block diagram used to establish an amplification device's 0101 bias current. This amplification can be provided by any device including but not limited to a bipolar transistor, a MOS transistor, a JFET transistor or a vacuum tube. A sense voltage 0105 is created by passing the device's current through resistor 0102. The resistor 0102 enables direct measurement of the amplification device's 0101 bias current by monitoring the sense node 0104 and applying ohm's law. A control loop 0103 can then compare the sense voltage 0105 to a given bias voltage 0107 and then operate on the amplification device 0101. The control loop's operation on the amplification device 0101 typically takes the form of adjusting the amplification device's control terminal (base, grid, gate) voltage until the sense voltage 0105 equals the bias voltage 0107. And in this way an optimal bias current is maintained through the amplification device 0101.

In the case of FIG. 1 the proportionality relationship between the bias voltage 0107 and sense voltage 0105 is 1:1 but generally need not be. What is important is for the bias voltage's 0107 DC component to faithfully represent the amplification device's 0101 DC bias current component independent of the input signal's 0109 amplitude.

For audio applications the control loop 0103 has a bandwidth as low as practicably possible so that it works only to correct the DC component of the sense voltage without impacting the information contained in higher frequencies. If the bandwidth of the control loop is too high it will work to reduce the amplitude of some portion of the audio spectrum which is undesirable.

FIG. 2 depicts an exemplary prior art block diagram with a "small" input voltage 0209 imposed on the input node 0108. Small is used to denote a signal which causes the amplification device 0101 to operate exclusively in the class A region. The sense voltage 0205 appearing at the sense node 0104 will exhibit no appreciable distortion and thus contributes no DC component to the sense voltage 0205. This in turn means no corrective action is taken by the control loop 0103 and the optimal device bias current is maintained. In other words there is a range of perturbing signal amplitudes that maintain class A operation and thus produce no appreciable distortion at the sense node 0104. Since no distortion appears at the sense voltage 0305 no control loop corrective action is taken and optimal device bias is preserved.

FIG. 3 depicts an exemplary prior art block diagram with a "large" input voltage 0309 imposed on the input node 0108. Large is used to denote a signal which causes the amplification device 0101 to operate in both the class A and class B regions. The sense voltage 0305 appearing at the sense node 0104 exhibits significant distortion in both the positive going excursion and the negative going excursion in the form of gain compression. This distortion produces an accompanying sense voltage 0305 DC component resulting in an undesirable control loop correction which moves the device from its optimal bias. In other words there is a range of perturbing signal amplitudes that cause departure from class A operation producing distortion in the sense voltage 0305 at the sense node 0104. The DC component of the distorted sense voltage 0305 initiates a control loop correction moving the device away from optimal bias.

The mechanisms which produce the positive and the negative distortion are different and uncorrelated. The positive going distortion being primarily caused by gain modulation due to high device current while the negative going distortion is primarily caused by gain modulation due to low device current. The net result of both distortions is the addition of a DC component to the sense voltage 0305 which causes the control loop 0103 to take corrective action and to improperly adjust the bias current away from the optimal value.

FIG. 4 introduces a diode signal conditioning block 0410 to the exemplary prior art control system of FIG. 1. The diode signal conditioning block 0410 attempts to minimize the distortion induced DC component at the diode conditioned node 0411 by limiting only its positive going voltage excursion.

FIG. 5a shows a prior art manifestation of the diode signal condition block 0410. FIG. 5b describes the high level 0501 and low level 0502 produced by the diode signal conditioning block 0410. The high level 0501 being substantially determined by a diode's forward voltage drop and the low level 0502 being substantially determined by the amplification device's 0101 low current operating behavior. The high level 0501 is not predictable because of the inherent temperature sensitivity of a diode forward voltage to temperature and the low level 0502 is not predictable because it is determined by amplification device's 0101 properties that can change over time.

The DC component of the diode conditioned voltage 0412 can then be viewed as resulting from a superposition of diode induced distortion during a positive going voltage excursion in conjunction with distortion produced as the amplification device 0101 is deprived of current during a negative voltage excursion. These two sources of distortion are clearly neither correlated, stabile nor predictable and thus sum to produce an unpredictable non-zero result resulting in a control loop correction.

Another limitation of the diode clamp embodiment is that a diode's resistance changes drastically as it goes from an off to an on state. The effectiveness of the clamping action then depends on the sense voltage's 0104 amplitude because this determines the degree to which the diode is on. In effect by using diodes, the limiting action can be segmented into three modes or regions. The first being the class A mode where no control loop correction is required and the input signal is small enough to keep the diodes in the diode signal conditioning block 0410 always off. The second region being the margin between class A and class B operation where the diodes are just beginning to conduct and the third region being the case where a large input signal is present forcing the diodes to be on for a significant portion of the cycle. In other words the character of the diode limiting distortion depends on the amplitude of the input signal which is unknown and variable. These issues represent the major shortcomings in the prior art approach.

FIG. 6 discloses the invention which provides a solution to the problem of class B operation influencing device bias current. The innovation is represented by the substitution of the diode signal conditioning block 0410 of FIG. 4 with the symmetrical signal conditioning block 0610. The purpose of the symmetrical signal conditioning block 0610 is to impose distortion on both the positive going excursion and the negative going excursion in a manner that is predicable, stable and correlated. Unlike in the prior art approach the symmetrical signal conditioning block 0610 provides positive limiting and negative limiting using a common mechanism whose temperature and operational stability is guaranteed. The superposition of the positive going and negative going distortions then produce a sum that more substantially cancels which prompts a smaller control loop 0103 correction.

FIG. 7a shows a more detailed invention block diagram which includes the symmetrical conditioning element 0710 as well as the clamp high terminal 0703 and the clamp low terminal 0704. The symmetrical conditioning element 0710 can take the form of any number of readily available, purpose built integrated circuits which serve to limit the positive and negative going voltages excursions of the sense voltage 0305 in response to the clamp high terminal 0703 and the clamp low terminal 0704. An example of such an integrated circuit is an Analog Devices AD8036 clamping amplifier FIG. 7b describes the high level 0701 and low level 0702 produced by the symmetrical conditioning element 0710. The high level 0701 is determined by the clamp high terminal 0703 and the low level 0702 is determined by the clamp low terminal 0704. It is important to note that neither the high level 0701 or low level 0702 depend on diode forward drops or any low current performance limitations of the amplification device 0101 unlike in the prior art approach.

The symmetrical signal conditioning provided by the symmetrical conditioning element 0710 takes the form of buffering and then limiting the sense voltage's 0305 excursions above and below the optimal bias point voltage. It is important the methodologies for limiting the positive and negative excursion are the same so as to produce symmetrical positive going and negative going waveform sections. This symmetry substantially minimizes the distortion induced DC component at the control loop input 0611 and thus minimizes the amount by which the control loop 0103 inadvertently adjusts device bias.

This specification makes obvious the advantages conferred by the disclosed invention over the prior art in maintaining an amplification device's optimal bias current. Symmetrically conditioning a sense voltage using a purpose built, integrated limiting circuit overcomes prior art deficiencies

I claim:

1. A system for controlling bias current of an electronic gain element to maintain an optimal bias current, comprising:
   an electronic gain element;
   a resistor connected to said electronic gain element such that a sense voltage across the resistor represents bias current through said electronic gain element;
   a signal conditioning element that limits said sense voltage to a high voltage level and to a low voltage level to create a conditioned voltage;
   a bias voltage which is proportional to said optimal bias current of said electronic gain element; and
   a control loop element for comparing said conditioned voltage with said bias voltage to control said electronic gain element such that said optimal bias current is maintained.

2. The system of claim 1, wherein said electronic gain element is intended to operate in class A, class AB and class B regions.

3. The system of claim 1, wherein said electronic gain element is a vacuum tube or a MOS JFET, or bipolar transistor.

4. The system of claim 1, wherein said electronic gain element is a vacuum tube.

5. The system of claim 1, wherein said signal conditioning element uses a common mechanism to affect a positive going and negative going limiting.

6. The system of claim 1, wherein said signal conditioning element is a clamping amplifier.

7. The system of claim 1, wherein said signal conditioning element is an Analog Devices AD8036 clamping amplifier.

8. The system of claim 1, wherein the control loop element has a bandwidth less than 20 Hz.

9. The system of claim 1, wherein said signal conditioning element allows control of said high voltage level and said low voltage level largely independent of temperature.

10. The system of claim 1, wherein said signal conditioning element allows control of said high voltage level and said low voltage level largely independent of drift over time.

11. The system of claim 1, wherein said signal conditioning element is a microcontroller.

12. The system of claim 1, wherein said signal conditioning element is a microprocessor.

13. A method for controlling the bias current of an electronic gain element to maintain an optimal bias current comprising:
   sensing a voltage across a resistor which represents said bias current of said electronic gain element;
   applying said sensed voltage to a conditioning element to limit said sensed voltage to a high voltage level and a low voltage level largely temperature independent to produce a conditioned voltage; and
   comparing said conditioned voltage and a bias voltage with a control loop element to control said electronic gain element such that said optimal bias current is maintained.

* * * * *